United States Patent [19]
Wong

[11] Patent Number: 5,120,987
[45] Date of Patent: Jun. 9, 1992

[54] TUNABLE TIMER FOR MEMORY ARRAYS

[76] Inventor: Robert C. Wong, 7 Thornberry Way, Poughkeepsie, N.Y. 12603

[21] Appl. No.: 648,116

[22] Filed: Jan. 31, 1991

[51] Int. Cl.$^5$ ............................................. H03K 3/00
[52] U.S. Cl. .................................. 307/265; 307/289; 307/594; 307/597
[58] Field of Search ............... 307/265, 289, 590, 591, 307/594, 597, 601, 602, 605

[56] References Cited

U.S. PATENT DOCUMENTS

| | | | |
|---|---|---|---|
| 3,048,708 | 8/1962 | Raver | 307/273 |
| 3,073,972 | 1/1963 | Jenkins | 307/601 X |
| 3,187,201 | 6/1965 | Eastman et al. | 307/273 X |
| 3,484,624 | 12/1969 | Rasiel et al. | 307/265 |
| 3,532,993 | 10/1970 | Kennedy | 307/265 X |
| 4,015,145 | 3/1977 | Stewart | 307/265 X |
| 4,277,697 | 7/1981 | Hall et al. | 307/265 |
| 4,574,204 | 3/1986 | Bonnet | 307/273 |

Primary Examiner—Robert J. Pascal
Attorney, Agent, or Firm—Donald M. Boles

[57] ABSTRACT

The present invention is directed to a tunable delay element incorporating one-half of a bipolar SRAM cell and a reference generator. In operation, the rising edge and incoming clock pulse sets the receiver/latch, latching the internal clock (i.e., the write pulse). The same rising edge of the clock pulse also functions to initiate the switching of the half memory cell in the tunable delay. When the half memory cell is switched halfway to its second state (relative to the referenced generator) the latch is disabled and the ICL write pulse goes low. The ICL write pulse is thus self-timed to be operational in the actual memory cell. Some delay circuitry is also provided for controlling the switching speed of the half memory cell in the tunable delay in order to selectively adjust the ICL pulse width.

8 Claims, 2 Drawing Sheets

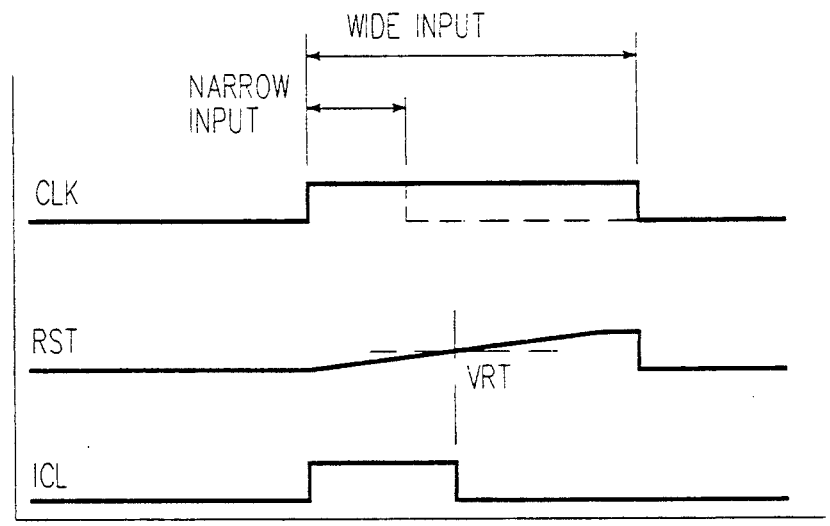
FIG. 2
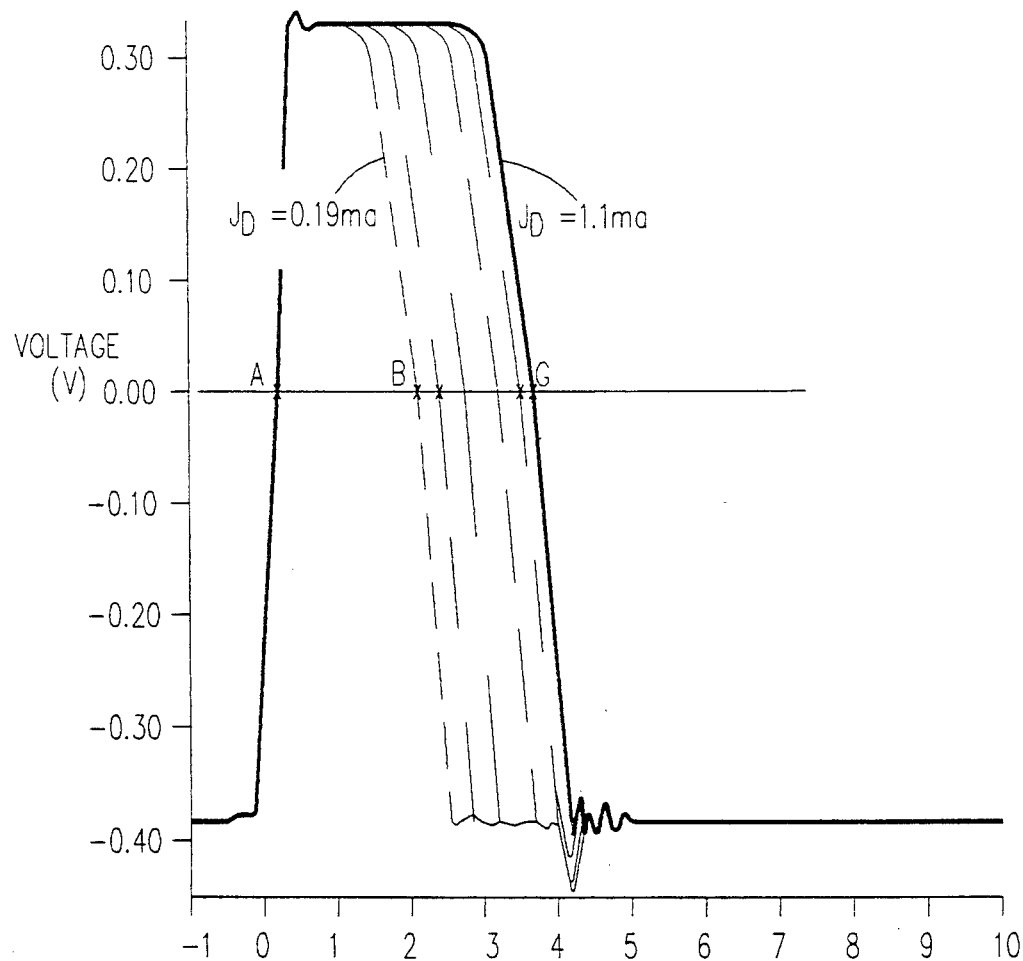
FIG. 3   TIME (NS)

TUNABLE TIMER FOR MEMORY ARRAYS

FIELD OF THE INVENTION

This invention relates, generally to memory arrays and more particularly to a tunable timer that generates adjustable pulse widths for use therewith.

BACKGROUND OF THE INVENTION

Timing circuits are needed for most memory arrays. However, they are generally very complex and inflexible. Additionally, most timing circuits utilize many extra logic circuits in order to guarantee the cycle time is truly chopped and adjusted to the proper width. It is not uncommon for six or seven stages of logic gates to surround a delay cell with the result that the delay contributed by the simulation and testing of the logic will not necessarily track the actual delay. The reason for this is that it is very expensive and time-consuming to adjust/add circuits/cells after manufacturing prototyping is done. Therefore, it is imperative to have accurate timing designed in during the preliminary stages of manufacturing.

Accordingly, internal clock pulse width is therefore de-facto generally fixed by design and cannot be "tuned". A pulse with tuning is highly desirable or necessary for a variety of reasons including precise on chip monitoring of array performance or clock pulse width adjustment in the early design phase so that one pass design can be more readily obtained.

A number of circuits have been designed to track timing. Some schemes can be found in, for example, U.S. Pat. No. 4,574,204 "Circuit for Holding a Pulse During a Predetermined Time Interval and an Improved Monostable Multivibrator" issued Mar. 4, 1986 to Bonnet; U.S. Pat. No. 4,425,514 "Fixed Pulse Width, Fast Recovery 1-Shot Pulse Generator" issued Jan. 10, 1984 to Orr et al.; U.S. Pat. No. 4,277,697 "Duty Cycle Control Apparatus" issued Jul. 7, 1981 to Hall et al.; U.S. Pat. No. 4,015,145 "Voltage Compensated Timing Circuit" issued Mar. 29, 1977 to Stewart; U.S. Pat. No. 3,532,993 "Valuable Period, Plural Input, Set-Reset 1-Shot Circuit" issued Oct. 6, 1970 to Kennedy; U.S. Pat. No. 3,484,624 "One-Shot Pulse Generator Circuit for Generating a Variable Pulse Width" issued Dec. 16, 1969 to Rasiel et al.; U.S. Pat. No. 3,187,201 "One-Shot Latch" issued Jun. 1, 1965 to Eastman et al.; U.S. Pat. No. 3,073,972 "Pulse Timing Circuit" issued Jan. 15, 1963 and U.S. Pat. No. 3,048,708 "Pulse Timing Control Circuit" issued Aug. 7, 1962.

However, as previously mentioned, all of these designs have at least one or more undesirable attributes in that they are not adjustable, or are imprecise (particularly so in the nanosecond time frame), use up large amounts of power, space and/or require additional adjacent circuits in order to be utilized.

Accordingly, it is an object of the present invention to produce a timer for memory arrays which does not require additional circuitry.

It is yet another object of the present invention to produce a timer for memory arrays which is utilizable for on chip timing measurements with accuracy much better than those of common wafer testers, which tester accuracy is about ±0.5 nano-seconds.

It is another object of the present invention to produce a timer which will generate a clock pulse which can be easily adjusted during the on-going design process and hence allow for one pass design.

It is yet another object of the present invention to produce a pulse generator for use in memory circuits including at least one pair of cross-coupled transistors configured as a latch and including a receiver circuit response to the rising edge of an external clock signal for initiating a pulse, a delay circuit connected to the receiver circuit and including at least one of the pairs of cross-coupled transistors, wherein the delay circuit is responsive to the rising edge of the external clock for initiating the switching of the state of the transistor, whereby the delay circuit operates to terminate the pulse when the state of the transistor is changed by a predetermined amount and whereby the width of the pulse is related to the switching time of the pair of cross-coupled transistors.

DESCRIPTION OF THE DRAWINGS

Reference is now made to the accompanying drawings in which:

FIG. 2 is the timing chart of the appropriate pulses utilized with respect to the present invention; and FIG. 3 is a diagram of the varying timing delays obtained by the tunable delay of the present invention.

DESCRIPTION OF THE PREFERRED EMBODIMENT

Operation of the Present Device

Figure 1:
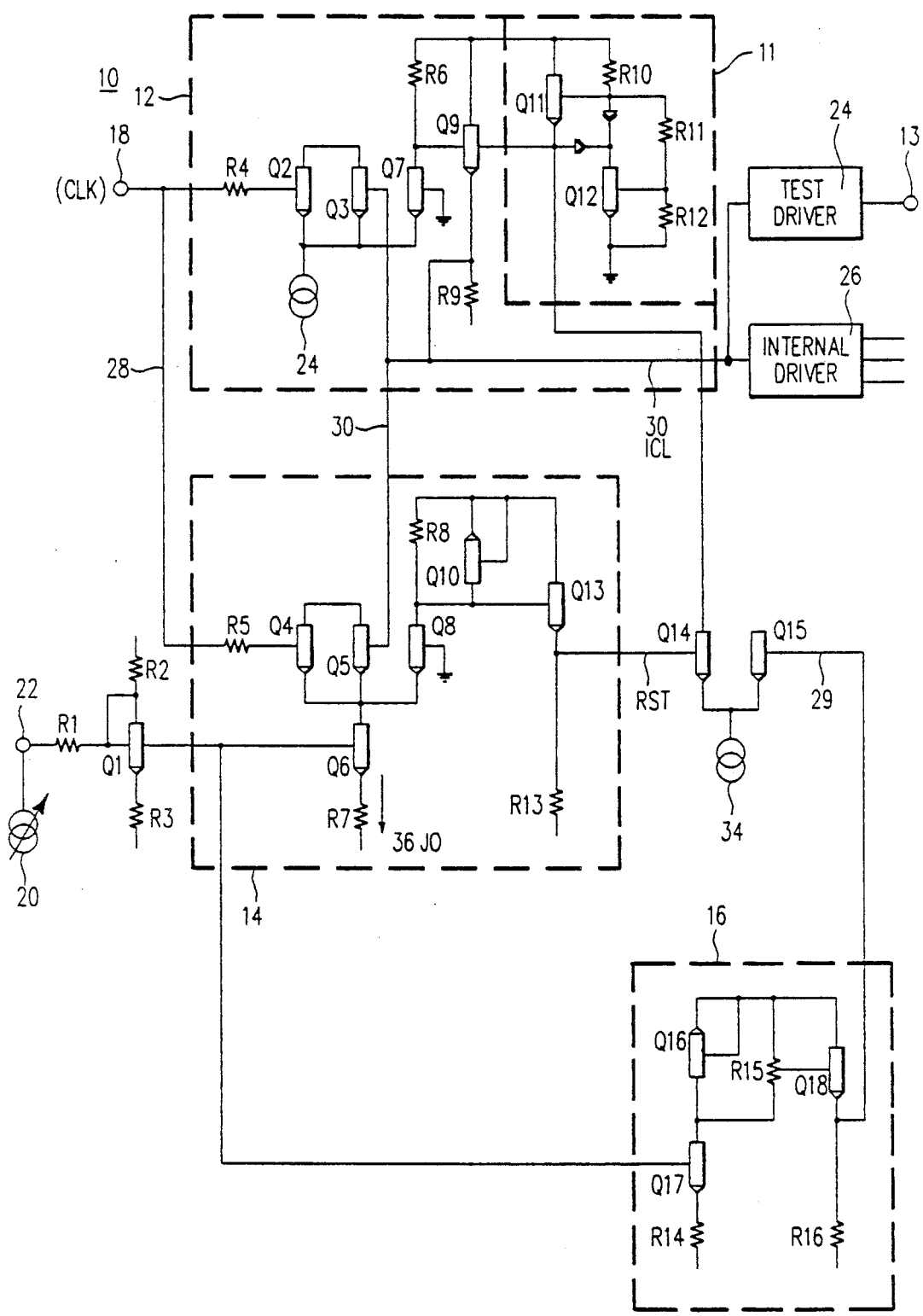
FIG. 1 is a schematic presentation of a timer utilizing the present invention.

Referring now to FIG. 1, there is shown a schematic diagram of the tunable timer 10 of the present invention. Preliminarily, it should be noted that the present invention utilizes bipolar diffusion capacitance as a delay element so that timer logic is greatly simplified. Additionally, this also allows for delay tuning by adjustment of the diffusion current through the "capacitor". The tunable timer 10 is generally comprised of a clock receiver circuit 12, a tunable delay portion 14 and a delay output voltage reference portion 16. The clock receiver circuit 12 effectively operates as a reset-dominant set/reset latch. The internal clock signal 30 (ICL) which drives internal driver 26 is triggered by the leading edge of clock (CLK) 18. Accordingly, since the leading edge of CLK is passed through the tunable delay element 14, it is this leading edge which will then reset the clock receiver circuit 12 latch. The uplevel of the internal clock is clamped to one-half $V_{be}$ above ground while the downlevel is clamped to one-half $V_{be}$ below ground with the ground clamp 11. Accordingly, the reset-dominated latch 12 can be formed in one receiver stage since the internal clock can be fed to the latch directly, with both swings compatible to those of clock (CLK) 18.

In operation, the rising edge of the external clock (CLK) 18 pulse sets the receiver/latch which latches the internal clock (ICL) 30 (i.e., a write pulse). The rising edge of the clock pulse also functions to initiate the switching of the memory cell in the tunable delay portion 14. When the memory cell has switched half way to its second state (relative to the reference generator 16, as shown in FIG. 2) the latch is disabled and internal clock (CLK) 30 goes low. The pulse 30 is thus self timed with the operation of the actual memory cell.

The reset signal (RST) will stay high as long as the external clock (CLK) 18 or internal clock (ICL) 30 remain high. Thus, as long as the external clock 18 stays active, at the high level, the internal clock 30 will not be reactivated after the first single shot. Additionally, if the latch happens to power up to the active up level, it will automatically be reset back to the inactive down level.

The tunable delay element 14 is normally on when the timer is inactive and internal clock (ICL) 30 is at a down level. Thus, the diffusion capacitance enhances the reset (RST) signal rise time and is proportional to JD current 36 minus current IR through resistor R8. Therefore, the diffusion capacitance can be precisely controlled through the tuning input. The reset (RST) signal time is much shorter and much less sensitive to JD current 36 because the cell junctions are reverse biased. Accordingly, the cycle time now can simply be the internal pulse width plus the additional small fall time of a delay element.

The access time of the delay of the cell associated with the tunable delay of the present invention can be obtained as follows:

(1) calibrate the ICL pulse width, with respect to JD current 36;
(2) use the leading edge of ICL to gate stimulus the input latch, and the trailing edge to gate the result to the output driver latch; and
(3) vary JD current 36 until the desired access fails.

Accordingly, the present invention can be extended to the internal access pad from any shift register latch (SRL) output to any shift register latch (SRL) input in a level sensitive scan design (LSSD). Calibration can be performed with direct scoping of the clock pulse width at different JD current settings. Additionally, path shifting oscillators for simple recirculating loops can also be constructed with the tunable delay element in order to calibrate the pulse width with frequency measurements. Independent of the input CLK pulse width, the internal clock ICL 30 has a fixed width for a fixed JD setting, as shown in FIG. 2. There it can be seen that internal clock ICL width is fixed by $V_{rt}$ as a result of the reset (RST) pulse.

Pulse sensitivity with respect to the tuning current is shown in FIG. 3. Voltage V is plotted against the time in nanoseconds. Voltage V is that voltage across resistor R9. Accordingly, it can readily be seen that adjusting JD dictates the diffusion capacitance and hence the pulse width of the internal clock of the present invention. JD settings are 0.19, 0.21, 0.27, 0.45, 0.69, 1.10 na as shown in FIG. 3.

CONSTRUCTION OF THE PRESENT DEVICE

With respect to FIG. 1, clock input 18 is connected to one terminal of resistor R4 and one terminal of resistor R5 (lead 28). The remaining terminal of resistor R4 is connected to the base of NPN transistor Q2. The collector of transistor Q2 is connected to the collector of transistor Q3 while the emitters of transistors Q2 and Q7 are connected together and then to current sink 24. The base of transistor Q7 is connected to ground while the base of transistor Q3 forms leads 30 which serves as the internal clock (ICL) signal inputs for internal driver 26 and test driver 24. The output of test driver 24 goes to a clock (CLK) test pad 13 (not shown). The base of transistor Q3 is also connected to the base of transistor Q5. The collector of Q7 is connected to the base of transistor Q9, the emitter of transistor Q11 and one terminal of resistor R6. The remaining terminal of resistor R6 is connected to the collector of transistor Q9 and Q11 and to one terminal of resistor R10. The emitter of transistor Q9 is connected to one terminal of resistor R9. The remaining terminal of resistor R10 is connected to the base of transistor Q11, the collector of transistor Q12 and one terminal of resistor R11. The remaining terminal of resistor R11 is connected to the base of transistor Q12 and to one terminal of resistor R12. The remaining terminal of resistor R12 is connected to the emitter of transistor Q12 and thence to ground. Reset clock lead 26 is connected to the collector of transistor Q14 and the emitter of transistor Q11.

Delay terminal 22 is connected to external current source 20 and to one terminal of resistor R1. The remaining terminal of resistor R1 is connected to the base of transistor Q1, one terminal of resistor R2, the base of transistor Q6 and the base of transistor Q17. The emitter of transistor Q1 is connected to one terminal of resistor R3. The collector of Q1 is connected to one terminal of resistors R2 and R1. The emitter of transistor Q6 is connected to one terminal of resistor R7. The remaining terminal 36 of resistor R7 forms terminal JD. The remaining lead of resistor R5 is connected to the base of transistor Q4. The collectors of transistors Q4, Q5 are connected to the emitter of Q8 and to the collector of transistor Q6. The base of transistor Q8 is connected to ground. The collector of transistor Q8 is connected to one terminal of resistor R8, the collector of transistor Q10 and to the base of transistor Q13. The remaining terminal of resistor R8 (which allows current IR to pass therethrough) is connected to the emitter of transistor Q10, and to the base of transistor Q10 and to the collector of transistor Q13. The emitter of transistor Q13 is connected to the base of transistor Q14 and to one terminal of resistor R13. The base terminal of resistor Q14 forms the reset lead (RST) as described more fully below. The emitters of transistors Q14 and Q15 are connected together and thence to current sink 34. The base of transistor Q15 is connected to one terminal of resistor R16 and the emitter of transistor Q18. The base of transistor Q17 is connected to the base of transistors Q1 and Q6. The collectors of transistors Q16 and Q17 are connected together and thence to one terminal of resistor R15. The emitter and base of transistor Q16 are connected to the remaining terminal of resistor R15 and to the collector of transistor Q18. The base of transistor Q18 is connected to resistor R16.

It is to be understood that the present invention is intended to be limited only by the claims appended hereto.

What is claimed is:

1. A pulse generator for use in a memory circuit including at least one pair of cross-coupled transistors configured as a latch, comprising:
    a receiver circuit responsive to the rising edge of an external clock signal for initiating a pulse; and
    a first delay circuit connected to said receiver circuit and including at least one of said pair of cross-coupled transistors, said first delay circuit responsive to the rising edge of said external clock for initiating the switching of the state of said at least one of said pair of cross-coupled transistors, wherein said first delay circuit operates to terminate the pulse when a state of said at least one of said pair of cross-coupled transistors is changed by a predetermined amount; and whereby the width of the pulse is related to the switching time of said pair of cross-coupled transistors.

2. A device according to claim 1 wherein said cross-coupled transistors are comprised of NPN transistors.

3. A device according to claim 1 wherein said receiver circuit is comprised of a reset-dominated set/reset latch.

4. A device according to claim 1 further comprising:
a second delay circuit connected to said first delay circuit and including at least a second pair of cross-coupled transistors for providing a voltage reference for measuring delay output of said first delay circuit.

5. A device according to claim 1 wherein said width of the pulse may be further adjusted by the diffusion current of a diffusion capacitance cell connected to said first pair of cross-coupled transistors.

6. A device according to claim 5 wherein said diffusion capacitance cell is comprised of at least one transistor.

7. A device according to claim 6 wherein said at least one transistor is biased by an adjustable external current control for adjusting the current through said transistor.

8. A device according to claim 1 further comprising a resistor connected to said at least one of said pair of cross-coupled transistors for controlling the current through said at least one transistor.

* * * * *